(12) United States Patent
Mozak et al.

(10) Patent No.: US 8,929,157 B2
(45) Date of Patent: Jan. 6, 2015

(54) POWER EFFICIENT, SINGLE-ENDED TERMINATION USING ON-DIE VOLTAGE SUPPLY

(71) Applicant: Intel Corporation, Santa Clara, CA (US)

(72) Inventors: Christopher P. Mozak, Beaverton, OR (US); Navindra Navaratnam, Ipoh (MY); Mahmoud Elassal, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 2 days.

(21) Appl. No.: 13/680,604

(22) Filed: Nov. 19, 2012

(65) Prior Publication Data

US 2014/0140146 A1 May 22, 2014

(51) Int. Cl.
G11C 7/00 (2006.01)
G05F 1/10 (2006.01)
G11C 5/14 (2006.01)

(52) U.S. Cl.
CPC . *G05F 1/10* (2013.01); *G11C 5/147* (2013.01)
USPC ............ 365/189.07; 365/189.08; 365/189.09; 365/189.11

(58) Field of Classification Search
CPC ......... G11C 7/1006; G11C 7/14; G11C 7/062
USPC .............. 365/189.07, 189.08, 189.09, 189.11
See application file for complete search history.

(56) References Cited

U.S. PATENT DOCUMENTS

| | | | | |
|---|---|---|---|---|
| 6,388,433 | B2 * | 5/2002 | Marty | 323/284 |
| 6,753,722 | B1 * | 6/2004 | Kondapalli et al. | 327/540 |
| 7,936,154 | B2 * | 5/2011 | Lee | 323/266 |
| 8,126,515 | B2 * | 2/2012 | Watanabe et al. | 455/572 |
| 2002/0135339 | A1 | 9/2002 | Tang et al. | |
| 2004/0135622 | A1 | 7/2004 | Masleid et al. | |
| 2005/0258814 | A1 | 11/2005 | Chen et al. | |
| 2010/0060083 | A1 | 3/2010 | Rolland | |
| 2012/0001603 | A1 | 1/2012 | Ouyang et al. | |
| 2013/0127736 | A1 * | 5/2013 | Judson et al. | 345/173 |
| 2013/0318581 | A1 * | 11/2013 | Counterman | 726/7 |

OTHER PUBLICATIONS

International Search Report & Written Opinion for International Application No. PCT/US2013/045025, Mailed Nov. 20, 2013, 11 pages.

* cited by examiner

*Primary Examiner* — Connie Yoha
(74) *Attorney, Agent, or Firm* — Blakely, Sokoloff, Taylor & Zafman LLP

(57) ABSTRACT

Circuitry to provide a supply voltage. A voltage regulator is coupled to receive a target reference signal. The voltage regulator generates a supply voltage (Vtt) and is coupled to receive the supply voltage as an input signal. An upper limit comparator receives an upper limit voltage signal that is higher than the target reference voltage signal and the supply voltage to generate a "too high" signal when the supply voltage exceeds an upper threshold. A lower limit comparator receives a lower limit voltage signal that is lower than the target reference voltage signal and the supply voltage to generate a "too low" signal when the supply voltage is below a lower threshold. A pull up current source is coupled to pull the supply voltage up in response to the too low signal. A pull down current source is coupled to pull the supply voltage down in response to the too high signal.

24 Claims, 2 Drawing Sheets

POWER EFFICIENT, SINGLE-ENDED TERMINATION USING ON-DIE VOLTAGE SUPPLY

TECHNICAL FIELD

Embodiments of the invention relate to techniques for termination of transmission lines. More particularly, embodiments of the invention relate to techniques for termination of transmission lines utilizing on-die voltage supplies.

BACKGROUND

Voltage regulator design for a supply voltage termination corresponds to a unique current profile that is determined by the system in which the voltage regulator will operate. In a typical termination configuration, the voltage regulator is generally required to source or sink equal amounts of current and the current demand is low frequency in nature. For example, many digital designs tend to slowly ramp up their current demand over several cycles and then slowly ramp back down again. However, this may not be the most efficient configuration.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
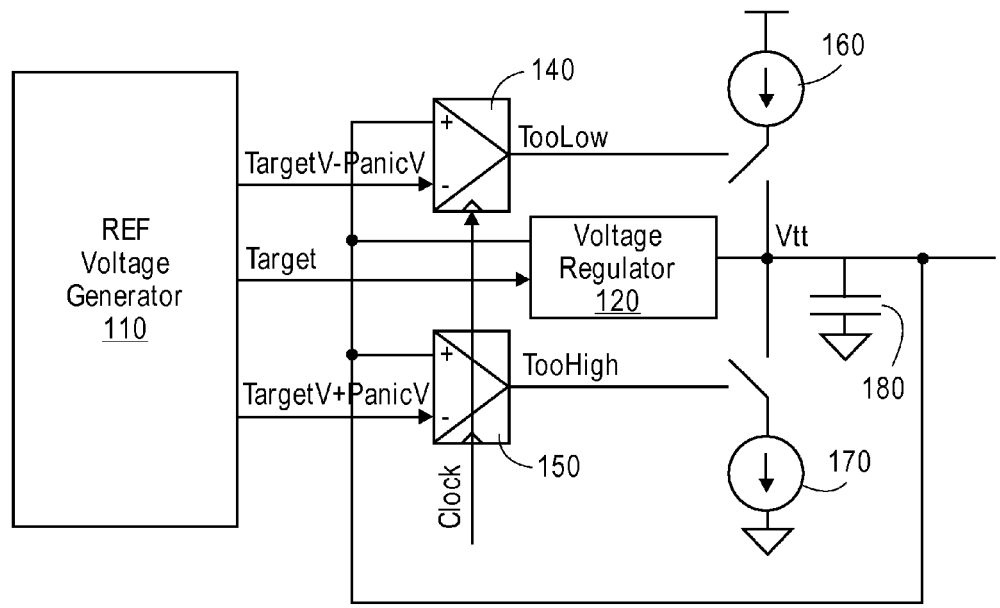
FIG. 1 is a circuit diagram of one embodiment of a circuit to provide a supply voltage.

In the following description, numerous specific details are set forth. However, embodiments of the invention may be practiced without these specific details. In other instances, well-known circuits, structures and techniques have not been shown in detail in order not to obscure the understanding of this description.

The voltage regulator designs described herein can be used to support a previously uncommon current profile. The voltage regulator described herein can support voltage changes that are high frequency in nature. For applications described herein the voltage supply can experience very rapid changes in current (dI/dt) that can, for example, switch from $+I_{max}$ to $-I_{max}$ in 100 ps. However, the average current over several cycles from a scrambled bus may be approximately 0. This 0 average current is especially true when there is a robust power delivery solution that can average the current demand across multiple lanes (Low R) and multiple cycles (High C).

In general, there are various types of termination schemes that consume different amounts of power. For example, center tap termination, which uses a resistance value of 2R between $V_{ss}$ and the termination node and a 2R value between $V_{DD}$ and the termination node consumes a certain amount ("X" in this example) of power. For $V_{dd}$ termination, which uses a resistance value of R between $V_{dd}$ and the termination node consumes ~2*X/3 power. For $V_{ss}$ termination, which uses a resistance value of R between $V_{ss}$ and the termination node consumes ~2*X/3 power. For $V_{tt}$ termination, which uses a resistance value of R between $V_{tt}$ (where $V_{tt}=V_{dd}/2$) and the termination node consumes ~X/3 power.

The need to support rapid current changes has limited this approach in the past to board-based solutions where high capacity, low inductance capacitors can be integrated close to the resistors. For example, DDR used a mid rail $V_{tt}$ termination scheme for the purpose of terminating the command and control signals using discrete resistors on the DIMM with local, low ESL capacitors. The techniques described herein support rapid current changes through improved regulator design and/or better power delivery, enabling a $V_{tt}$ regulator and termination to be integrated on to a silicon die with limited access to large capacitors with low inductance path. In some applications, on die termination may be preferable due to the ability to digitally control when termination is enabled and the targeted resistance value.

Traditionally, the bandwidth of a voltage regulator is limited by the need to maintain stability. Although this bandwidth can be increased by using a combination of poles and zeros, even this approach has limitations and works best for a current demand with a low pass profile. The multiple pole/zero approach can also be difficult to control across HVM variability. This makes it difficult to create a high bandwidth regulator that can deliver high dI/dt without consuming large static currents or using large, low ESL capacitors.

Embodiments described herein utilize a charge pump regulator that is not a linear time invariant (LTI) system. As a result, the regulator is not subject to the traditional bandwidth-stability tradeoffs associated with LTI systems. As described below, the main driver is a charge pump with a pull up mechanism and a pull down mechanism that are mutually exclusive. In one embodiment, there is a dead band region between the charge pump pull up reference voltage and the pull down reference voltage. This makes the design non-LTI (i.e., it does not obey superposition) and effectively trades high ripple (with a magnitude defined by the dead band region) for bandwidth/stability.

In one embodiment, the maximum charge pump current (and, to a lesser extent, maximum load current) is limited by the capacitance, the size of the dead band region and how quickly the loop can sample, which can be characterized by:

$$I_{max} < \frac{(2 C_{die} V_{band})}{T_{clk}}$$

where $I_{max}$ the maximum current, $C_{die}$ represents the on-die capacitance, $V_{band}$ represents half of the voltage dead band region, and $T_{clk}$ represents the sampling period or latency of the feedback loop. This design also has the advantage of consuming little or no quiescent current in the output driver, which results in very high efficiency.

FIG. 1 is a circuit diagram of one embodiment of a circuit to provide a supply voltage. The supply voltage may be used, for example, as part of a termination scheme for input/output (I/O) lines. In one embodiment, the supply voltage provided ($V_{tt}$) for the termination components is half of a supply voltage ($V_{dd}$) provided for functional circuit elements. In other embodiments, the supply voltage provided (Vtt) for the termination components is set equal to the common mode voltage on the IO transmission lines. The system of FIG. 1 is a non-linear system.

Reference voltage generator 110 generates reference voltage levels to be used for voltage regulation purposes. Reference voltage regulator 110 may receive commands or other indications of the reference voltage levels to be used. In one embodiment, reference voltage regulator includes a digital-to-analog converter to generate the reference voltages.

The example of FIG. 1 includes three reference voltages—a target voltage, an upper limit voltage and a lower limit voltage—however any number of reference voltages can be supported. For example graduated upper and lower limits may be used to provide a more proportional response in the 160 and 170 current sources.

Reference voltage generator 110 provides a target voltage level to voltage regulator 120, which operates to provide the supply voltage, $V_{tt}$, to one or more circuit/termination components (not illustrated in FIG. 1). This regulator may not be present in all implementations and usually only serves to supply low frequency current demand. Voltage regulator 120 receives the supply voltage as an input signal as well.

Lower limit comparator 140 receives as a reference signal a voltage level that is a preselected amount less than the target voltage. This lower limit voltage corresponds to a lower acceptable operating condition. In response to the supply voltage crossing this threshold, lower limit comparator 140 asserts a "too low" signal to enable an output from current source 160, which quickly pulls the supply voltage up.

Upper limit comparator 150 receives as a reference signal a voltage level that is a preselected amount greater than the target voltage. This upper limit voltage corresponds to an upper acceptable operating condition. In response to the supply voltage crossing this threshold, upper limit comparator 150 asserts a "too high" signal to enable an output from current source 170, which quickly pulls the supply voltage down.

In some embodiments, the regulator may be combined with a more traditional low bandwidth, low pass linear regulator as represented by voltage regulator 120. This may allow for lower power operation in low power modes where the high bandwidth digital-to-analog converters/comparators (i.e., 110, 140, 150) consume too much power and may not be needed. It may also enable higher load currents to be supplied at low frequency.

In other embodiments, the comparators in the regulator may use offset cancellation techniques to eliminate offset in the comparators and/or linear regulator. In some embodiments, multiple levels/comparators may be used to provide a more proportional response to the current driver(s). Similar effects can also be achieved by using an analog comparator output that scales the charge pump current proportionally to the input differential voltage.

In other embodiments, a resistor driver may be used instead of a current source driver (i.e., 160, 170). This may provide a similar response that may provide lower power consumption and/or cost. Some embodiments may provide mechanisms to compensate current sources 160 and 170 (or resistors depending on the implementation) to reduce the effects of systematic and random variation due to process, voltage, temperature effects common in high volume, modern silicon manufacturing processes. Current sources 160 and 170 may be further programmable to allow their strength to be selected based on the expected current demand, operating frequency or other factors.

Figure 2:
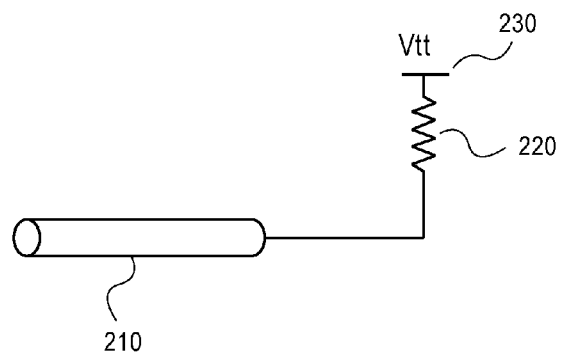
FIG. 2 is a circuit diagram of one embodiment of a termination scheme that may utilize the supply voltage provided by the circuit of FIG. 1.

FIG. 2 is a circuit diagram of one embodiment of a termination scheme that may utilize the supply voltage provided by the circuit of FIG. 1. The example of FIG. 2 illustrates only a single transmission line; however, any number of transmission lines can be utilized and coupled with the voltage supply.

In one embodiment, all of the elements of the voltage supply circuitry (FIG. 1) and the termination circuitry (FIG. 2) reside on the die to which transmission line 210 is coupled. In one embodiment, transmission line 210 is used for I/O signaling; however, other types of signals may also be transmitted over transmission line 210.

Voltage rail 230 provides a supply voltage for termination of transmission line 210. In one embodiment, the voltage supplied by voltage rail 230 comes from the circuit of FIG. 1. Resistor 220 is coupled between the end of transmission line 210 and voltage rail 230 to provide termination for transmission line 210. The resistance value of resistor 220 can be selected in any manner known in the art in order to provide the desired termination characteristics.

In one embodiment, the I/O signal that is driven on transmission line 210 will have a symmetrical voltage swing around the $V_{tt}$ voltage. In the case of I/O signals that are DC balanced (or close to DC balanced due to the use scrambling, for example), this results in equal amounts of current being sourced and sinked from the $V_{tt}$ rail on average, resulting in zero average current being drawn from the regulator. This symmetrical swing may reduce the power consumption of the $V_{tt}$ termination and associated $V_{tt}$ voltage regulator.

Figure 3:
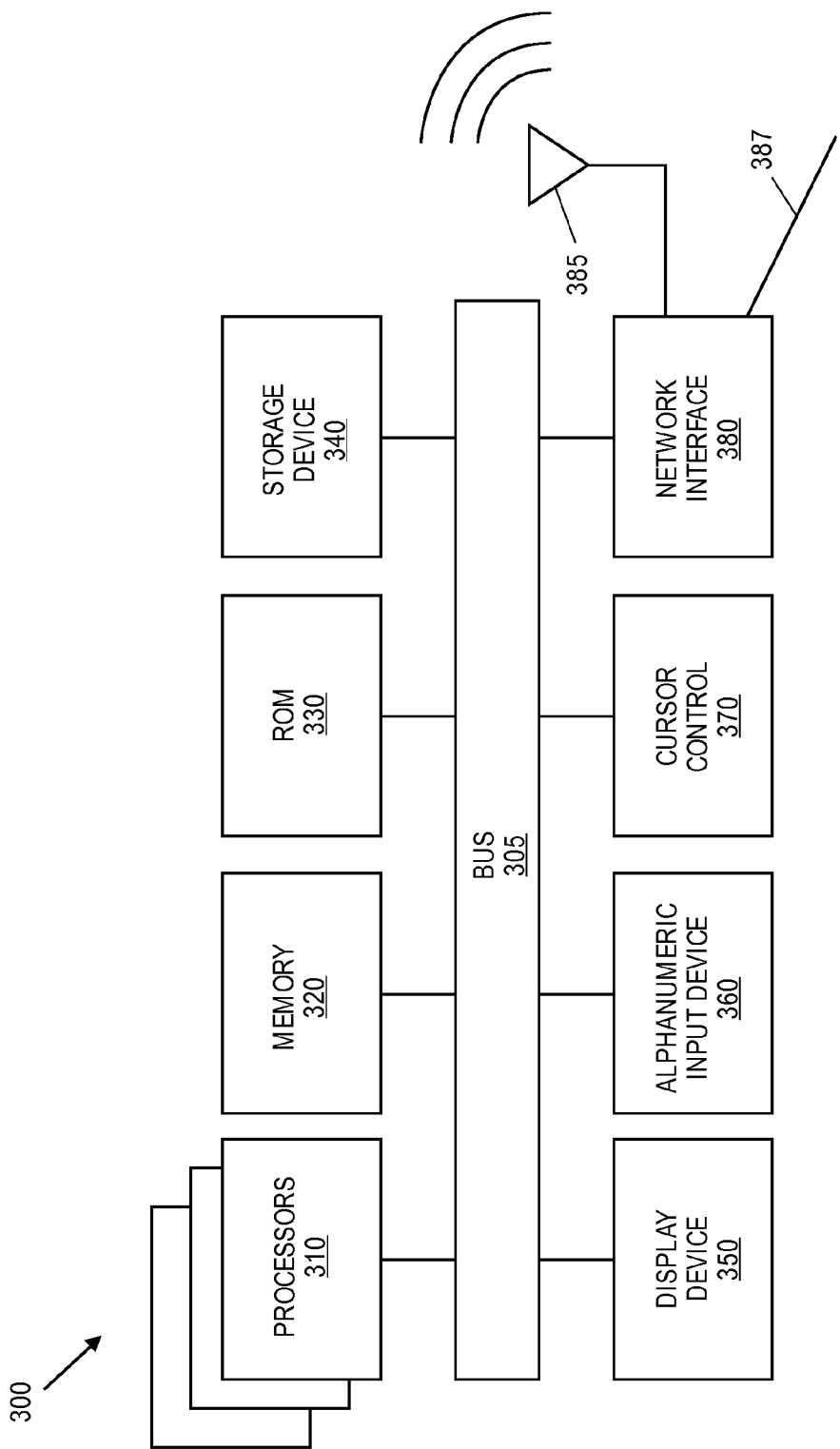
FIG. 3 is a block diagram of one embodiment of an electronic system.

FIG. 3 is a block diagram of one embodiment of an electronic system. The electronic system illustrated in FIG. 3 is intended to represent a range of electronic systems (either wired or wireless) including, for example, desktop computer systems, laptop computer systems, cellular telephones, personal digital assistants (PDAs) including cellular-enabled PDAs, set top boxes. Alternative electronic systems may include more, fewer and/or different components.

Electronic system 300 includes bus 305 or other communication device to communicate information, and processor 310 coupled to bus 305 that may process information. While electronic system 300 is illustrated with a single processor, electronic system 300 may include multiple processors and/or co-processors. Electronic system 300 further may include random access memory (RAM) or other dynamic storage device 320 (referred to as main memory), coupled to bus 305 and may store information and instructions that may be executed by processor 310. Main memory 320 may also be used to store temporary variables or other intermediate information during execution of instructions by processor 310.

Electronic system 300 may also include read only memory (ROM) and/or other static storage device 330 coupled to bus 305 that may store static information and instructions for processor 310. Data storage device 340 may be coupled to bus 305 to store information and instructions. Data storage device 340 such as a magnetic disk or optical disc and corresponding drive may be coupled to electronic system 300.

Electronic system 300 may also be coupled via bus 305 to display device 350, such as a cathode ray tube (CRT) or liquid crystal display (LCD), to display information to a user. Alphanumeric input device 360, including alphanumeric and other keys, may be coupled to bus 305 to communicate information and command selections to processor 310. Another type of user input device is cursor control 370, such as a mouse, a trackball, or cursor direction keys to communicate direction information and command selections to processor 310 and to control cursor movement on display 350.

Electronic system 300 further may include network interface(s) 380 to provide access to a network, such as a local area network. Network interface(s) 380 may include, for example, a wireless network interface having antenna 385, which may represent one or more antenna(e). Network interface(s) 380 may also include, for example, a wired network interface to communicate with remote devices via network cable 387, which may be, for example, an Ethernet cable, a coaxial cable, a fiber optic cable, a serial cable, or a parallel cable.

In one embodiment, network interface(s) 380 may provide access to a local area network, for example, by conforming to IEEE 802.11b and/or IEEE 802.11g standards, and/or the wireless network interface may provide access to a personal area network, for example, by conforming to Bluetooth standards. Other wireless network interfaces and/or protocols can also be supported.

IEEE 802.11b corresponds to IEEE Std. 802.11b-1999 entitled "Local and Metropolitan Area Networks, Part 11: Wireless LAN Medium Access Control (MAC) and Physical Layer (PHY) Specifications: Higher-Speed Physical Layer Extension in the 2.4 GHz Band," approved Sep. 16, 1999 as well as related documents. IEEE 802.11g corresponds to IEEE Std. 802.11g-2003 entitled "Local and Metropolitan Area Networks, Part 11: Wireless LAN Medium Access Control (MAC) and Physical Layer (PHY) Specifications, Amendment 4: Further Higher Rate Extension in the 2.4 GHz Band," approved Jun. 27, 2003 as well as related documents. Bluetooth protocols are described in "Specification of the Bluetooth System: Core, Version 1.1," published Feb. 22, 2001 by the Bluetooth Special Interest Group, Inc. Associated as well as previous or subsequent versions of the Bluetooth standard may also be supported.

In addition to, or instead of, communication via wireless LAN standards, network interface(s) 380 may provide wireless communications using, for example, Time Division, Multiple Access (TDMA) protocols, Global System for Mobile Communications (GSM) protocols, Code Division, Multiple Access (CDMA) protocols, and/or any other type of wireless communications protocol.

In one embodiment, an apparatus includes a voltage regulator coupled to receive a target reference voltage signal. The voltage regulator generates a supply voltage (Vtt) and is also coupled to receive the supply voltage as an input signal. An upper limit comparator is coupled to receive an upper limit voltage signal that is higher than the target reference voltage signal and the supply voltage. The upper limit comparator generates a too high signal when the supply voltage exceeds an upper threshold. A lower limit comparator is coupled to receive a lower limit voltage signal that is lower than the target reference voltage signal and the supply voltage. The lower limit comparator to generate a too low signal when the supply voltage is below a lower threshold. A pull up current source is coupled to operate to pull the supply voltage up in response to the too low signal. A pull down current source is coupled to operate to pull the supply voltage down in response to the too high signal.

In one embodiment, the apparatus further includes a transmission line and a resistive element coupled between the transmission line and the supply voltage. In one embodiment, the voltage regulator, the upper limit comparator, the lower limit comparator, the pull up current source, the pull down current source and the resistive element reside on a single integrated circuit die.

In one embodiment, the transmission line couples the single integrated circuit die to a remote integrated circuit die. In one embodiment, the remote integrated circuit die comprises a dynamic random access memory (DRAM). In one embodiment, I/O voltage swings are substantially symmetric around Vtt and I/O signaling is balanced. In one embodiment, the transmission line is coupled to provide signals to a touch-screen device.

In one embodiment, the pull up current source and the pull down current source comprise current source drivers. In one embodiment, the pull up current source and the pull down current source comprise resistor drivers. In one embodiment, $V_{tt}$ is substantially half of a supply voltage used for logic circuits on the die. In one embodiment, output signals from the upper limit comparator and the lower limit comparator cause the pull down current source and pull up current source, respectively, to scale proportionally to the input differential voltage to the respective comparators.

In one embodiment, a system includes a voltage regulator coupled to receive a target reference voltage signal. The voltage regulator to generate a supply voltage (Vtt), the voltage regulator is also coupled to receive the supply voltage as an input signal. An upper limit comparator is coupled to receive an upper limit voltage signal that is higher than the target reference voltage signal and the supply voltage. The upper limit comparator generates a too high signal when the supply voltage exceeds an upper threshold. A lower limit comparator is coupled to receive a lower limit voltage signal that is lower than the target reference voltage signal and the supply voltage. The lower limit comparator generates a too low signal when the supply voltage is below a lower threshold. A pull up current source is coupled to operate to pull the supply voltage up in response to the too low signal. A pull down current source is coupled to operate to pull the supply voltage down in response to the too high signal. A transmission line is coupled to receive the supply voltage. A resistive element is coupled between a first end of the transmission line and the supply voltage. A dynamic random access memory (DRAM) array coupled with a second end of the transmission line.

In one embodiment, the voltage regulator, the upper limit comparator, the lower limit comparator, the pull up current source, the pull down current source and the resistive element reside on a single integrated circuit die. In one embodiment, the transmission line is coupled to provide signals to a touch-screen device. In one embodiment, the pull up current source and the pull down current source comprise current source drivers.

In one embodiment, the pull up current source and the pull down current source comprise resistor drivers. In one embodiment, $V_{tt}$ is substantially half of a supply voltage used for logic circuits on the die. In one embodiment, output signals from the upper limit comparator and the lower limit comparator cause the pull down current source and pull up current source, respectively, to scale proportionally to the input differential voltage to the respective comparators. In one embodiment, I/O voltage swings are substantially symmetric around Vtt and I/O signaling is balanced.

In one embodiment, a tablet computing device includes a touch screen interface. A voltage regulator is coupled to receive a target reference voltage signal. The voltage regulator to generate a supply voltage (Vtt). The voltage regulator also coupled to receive the supply voltage as an input signal. An upper limit comparator is coupled to receive an upper limit voltage signal that is higher than the target reference voltage signal and the supply voltage. The upper limit comparator to generate a too high signal when the supply voltage exceeds an upper threshold. A lower limit comparator is coupled to receive a lower limit voltage signal that is lower than the target reference voltage signal the supply voltage. The lower limit comparator to generate a too low signal when the supply voltage is below a lower threshold. A pull up current source is coupled to operate to pull the supply voltage up in response to the too low signal. A pull down current source is coupled to operate to pull the supply voltage down in response to the too high signal.

In one embodiment, the tablet computing device further includes a transmission line and a resistive element coupled between the transmission line and the supply voltage. In one embodiment, the voltage regulator, the upper limit comparator, the lower limit comparator, the pull up current source, the pull down current source and the resistive element reside on a single integrated circuit die. In one embodiment, the transmission line couples the single integrated circuit die to a remote integrated circuit die. In one embodiment, the remote integrated circuit die comprises a dynamic random access memory (DRAM).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. An apparatus comprising:
  a voltage regulator coupled to receive a target reference voltage signal, the voltage regulator to generate a supply voltage (Vtt), the voltage regulator also coupled to receive the supply voltage as an input signal;
  an upper limit comparator to receive an upper limit voltage signal that is higher than the target reference voltage signal and the supply voltage, the upper limit comparator to generate a too high signal when the supply voltage exceeds an upper threshold;
  a lower limit comparator to receive a lower limit voltage signal that is lower than the target reference voltage signal and the supply voltage, the lower limit comparator to generate a too low signal when the supply voltage is below a lower threshold;
  a programmable pull up current source coupled to operate to pull the supply voltage up in response to the too low signal;
  a programmable pull down current source coupled to operate to pull the supply voltage down in response to the too high signal.

2. The apparatus of claim 1 further comprising:
  a transmission line;
  a resistive element coupled between the transmission line and the supply voltage.

3. The apparatus of claim 2 wherein the voltage regulator, the upper limit comparator, the lower limit comparator, the pull up current source, the pull down current source and the resistive element reside on a single integrated circuit die.

4. The apparatus of claim 3 wherein the transmission line couples the single integrated circuit die to a remote integrated circuit die.

5. The apparatus of claim 4 wherein the remote integrated circuit die comprises a dynamic random access memory (DRAM).

6. The apparatus of claim 2 wherein I/O voltage swings are substantially symmetric around Vtt and I/O signaling is balanced.

7. The apparatus of claim 2 wherein the transmission line is coupled to provide signals to a touchscreen device.

8. The apparatus of claim 1 wherein the pull up current source and the pull down current source comprise current source drivers.

9. The apparatus of claim 1 wherein the pull up current source and the pull down current source comprise resistor drivers.

10. The apparatus of claim 3 wherein $V_{tt}$ is substantially half of a supply voltage used for logic circuits on the die.

11. The apparatus of claim 1 wherein output signals from the upper limit comparator and the lower limit comparator cause the pull down current source and pull up current source, respectively, to scale proportionally to the input differential voltage to the respective comparators.

12. A system comprising:
  a voltage regulator coupled to receive a target reference voltage signal, the voltage regulator to generate a supply voltage (Vtt), the voltage regulator also coupled to receive the supply voltage as an input signal;
  an upper limit comparator to receive an upper limit voltage signal that is higher than the target reference voltage signal and the supply voltage, the upper limit comparator to generate a too high signal when the supply voltage exceeds an upper threshold;
  a lower limit comparator to receive a lower limit voltage signal that is lower than the target reference voltage signal and the supply voltage, the lower limit comparator to generate a too low signal when the supply voltage is below a lower threshold;
  a programmable pull up current source coupled to operate to pull the supply voltage up in response to the too low signal;
  a programmable pull down current source coupled to operate to pull the supply voltage down in response to the too high signal;
  a transmission line;
  a resistive element coupled between a first end of the transmission line and the supply voltage
  a dynamic random access memory (DRAM) array coupled with a second end of the transmission line.

13. The system of claim 12 wherein the voltage regulator, the upper limit comparator, the lower limit comparator, the pull up current source, the pull down current source and the resistive element reside on a single integrated circuit die.

14. The system of claim 13 wherein the transmission line is coupled to provide signals to a touchscreen device.

15. The system of claim 12 wherein the pull up current source and the pull down current source comprise current source drivers.

16. The system of claim 12 wherein the pull up current source and the pull down current source comprise resistor drivers.

17. The system of claim 13 wherein $V_{tt}$ is substantially half of a supply voltage used for logic circuits on the die.

18. The system of claim 12 wherein output signals from the upper limit comparator and the lower limit comparator cause the pull down current source and pull up current source, respectively, to scale proportionally to the input differential voltage to the respective comparators.

19. The system of claim 12 wherein I/O voltage swings are substantially symmetric around Vtt and I/O signaling is balanced.

20. A tablet computing device comprising:
  a touch screen interface;
  a voltage regulator coupled to receive a target reference voltage signal, the voltage regulator to generate a supply voltage (Vtt), the voltage regulator also coupled to receive the supply voltage as an input signal;
  an upper limit comparator to receive an upper limit voltage signal that is higher than the target reference voltage signal and the supply voltage, the upper limit comparator to generate a too high signal when the supply voltage exceeds an upper threshold;
  a lower limit comparator to receive a lower limit voltage signal that is lower than the target reference voltage signal and the supply voltage, the lower limit comparator to generate a too low signal when the supply voltage is below a lower threshold;

a programmable pull up current source coupled to operate to pull the supply voltage up in response to the too low signal;

a programmable pull down current source coupled to operate to pull the supply voltage down in response to the too high signal.

21. The tablet of claim 20 further comprising:

a transmission line;

a resistive element coupled between the transmission line and the supply voltage.

22. The tablet of claim 21 wherein the voltage regulator, the upper limit comparator, the lower limit comparator, the pull up current source, the pull down current source and the resistive element reside on a single integrated circuit die.

23. The tablet of claim 22 wherein the transmission line couples the single integrated circuit die to a remote integrated circuit die.

24. The tablet of claim 23 wherein the remote integrated circuit die comprises a dynamic random access memory (DRAM).

\* \* \* \* \*